(12) United States Patent
Kawakubo et al.

(10) Patent No.: US 7,847,252 B2
(45) Date of Patent: Dec. 7, 2010

(54) INFRARED-DETECTING ELEMENT AND INFRARED IMAGE SENSOR USING THE SAME

(75) Inventors: Takashi Kawakubo, Kanagawa-ken (JP); Michihiko Nishigaki, Kanagawa-ken (JP); Toshihiko Nagano, Kanagawa-ken (JP); Yoshinori Iida, Tokyo (JP); Ikuo Fujiwara, Kanagawa-ken (JP); Hiroto Honda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/207,744

(22) Filed: Sep. 10, 2008

(65) Prior Publication Data

US 2009/0200471 A1 Aug. 13, 2009

(30) Foreign Application Priority Data

Sep. 10, 2007 (JP) ............................. 2007-234696

(51) Int. Cl.
*H01L 27/14* (2006.01)

(52) U.S. Cl. .................................. 250/338.3
(58) Field of Classification Search ............... 250/338.3
See application file for complete search history.

(56) References Cited

U.S. PATENT DOCUMENTS

| | | | |
|---|---|---|---|
| 4,902,894 A * | 2/1990 | Butler et al. ............. | 250/338.1 |
| 5,641,973 A | 6/1997 | Shigenaka et al. | |
| 6,121,615 A * | 9/2000 | Ito ........................... | 250/338.3 |
| 6,429,428 B1 * | 8/2002 | Parsons et al. ........... | 250/338.2 |
| 2006/0186339 A1 * | 8/2006 | Sasaki et al. ............. | 250/338.1 |

FOREIGN PATENT DOCUMENTS

JP 08-088338 4/1996

OTHER PUBLICATIONS

V. Fuflyigin, E. Salley, A. Osinsky, and P. Norris, "Pyroelectric properties of AlN." Applied Physics Letters, vol. 77, No. 19, Nov. 6, 2000, pp. 3075-3077 <doi:10.1063/1.1324726>.*

* cited by examiner

*Primary Examiner*—Constantine Hannaher
(74) *Attorney, Agent, or Firm*—Turocy & Watson, LLP

(57) ABSTRACT

An infrared-detecting element includes: a substrate; a laminated body; an anchor coupling a part of the laminated body with the substrate and supporting the laminated body with a gap above the substrate; and an amplifier provided on the substrate and connected to at least one of the lower electrode and the upper electrode. The laminated body has a lower electrode, an upper electrode, and a piezoelectric film made of aluminum nitride which is provided between the lower electrode and the upper electrode and in which a c-axis is oriented almost perpendicularly to a film plane. The amplifier has a circuit performing conversion into voltage according to a charge generated in the laminated body.

16 Claims, 12 Drawing Sheets

INFRARED-DETECTING ELEMENT AND INFRARED IMAGE SENSOR USING THE SAME

CROSS-REFERENCE TO RELATED APPLICATIONS

This application is based upon and claims the benefit of priority from the prior Japanese Patent Application No. 2007-234696, filed on Sep. 10, 2007; the entire contents of which are incorporated herein by reference.

BACKGROUND OF THE INVENTION

1. Field of the Invention

This invention relates to an infrared-detecting element using a piezoelectric film and to an infrared image sensor using the same.

2. Background Art

All of infrared-detecting elements used generally for consumers are uncooled-type infrared-detecting elements and classified roughly to pyroelectric type and bolometer type.

In a pyroelectric-type infrared sensor, it is necessary that a special material called as pyroelectric body is used as the infrared-detecting element. Representatively, a material of a lead titanate or a barium titanate, which are ferroelectric materials of oxide, is used. However, in these materials, crystallization temperature is high, and ion etching is difficult, and a precious-metal electrode material is required because the materials are oxides. From such reasons, there is a problem that it is difficult to prepare the materials directly on a silicon substrate for an infrared sensor produced by CMOS process.

Accordingly, instead of the monolithic process of CMOS, a complicated expensive hybrid process using a bonding technique or the like cannot help being used.

For example, as an example of the pyroelectric-type infrared-detecting element, there is a method for producing the infrared-detecting element, including: forming an orientational oxide ground film on a substrate; forming the pyroelectric body and a resin film thereon; then bonding another substrate thereto; and then dissolving and removing the orientational oxide ground film.

However, the pyroelectric-type infrared-detecting element has had some problems.

The first problem is that the complicated steps of bonding and of dissolving and removing the substrate in the production of the detecting element become large obstacles in reliability, accuracy, microfabrication, and preparation of array.

The second problem is that an amplifier connected to the infrared-detecting element cannot help being provided on a different substrate from the substrate of the infrared-detecting element, and the infrared-detecting element and the amplifier come to be connected with interconnection. Therefore, in comparison with the case that the infrared-detecting portion and the amplifier are formed in a lump on a single substrate only by a thin-film step, noise or the like easily enters therein and the detection accuracy deteriorates.

On the other hand, in a bolometer-type infrared sensor, temperature coefficient of resistance when infrared is irradiated to a resistance element is utilized and detected. As the resistance element, a thermistor, a p-n diode, or the like can be used, and can be monolithically produced on a silicon substrate, and therefore, has been actively researched. However, the largest problem of the bolometer-type infrared sensor is badness of detection sensitivity. For reading the resistance value, it is necessary that bias current is flowed through the resistance element and therefore the change amount of generated voltage due to temperature is detected. However, with respect to various noises such as Johnson noise contained in voltage generated in the resistance element, the voltage change amount generated by temperature change by infrared irradiation is small and therefore S/N ratio is bad and detection with good sensitivity is very difficult.

Moreover, instead of the bolometer type and the pyroelectric type, there has been proposed the infrared-detecting element of pseudo pyroelectric effect type by which temperature rise by infrared irradiation is detected through thermal strain by using a piezoelectric body as the detection element (Japanese Patent No. 3311869).

In the Japanese Patent No. 3311869, the piezoelectric film includes compound semiconductors such as $PbTe$, $PbSe$, $PbS$, $HgTe$, $HgSe$, $Hg_{1-x}Cd_xTe$, $GaSb$, $GaAs$, $InP$, $InAs$, $InSb$, $Ge$, $Mg_2Si$, $Mg_2Ge$, $Mg_2Sn$, $Ca_2Sn$, $Ca_2Pb$, $ZnSb$, $ZnAs_2$, $Zn_3As_2$, $CdSb$, $CdAs_2$, $Cd_3As_2$, $Bi_2Se_3$, $Bi_2Te_3$, $Sb_2Te_3$, $As_2Se_3$, $As_2Te_3$, $PtSb_2$, $In_2Se_3$, and $In_2Te_3$. However, when such a material is film-formed on a silicon substrate, it is not easy to produce a single crystal film having sufficient piezoelectricity or a high orientational film. And, a particular devisal therefor has not been disclosed, either. Moreover, the particular desirable piezoelectric film includes $HgTe$, $Hg_{1-x}Cd_xTe$, $InSb$, $Cd_3As_2$, $Bi_2Te_3$, and $PtSb_2$, which are narrow band gap semiconductors. However, because the band gap is narrow, leak current is necessarily very large and it involves very large difficulty to perform reading in room temperature. Moreover, thermal expansion difference between the piezoelectric body and the substrate is utilized and the piezoelectric body is formed directly on the substrate, and therefore, the received heat by infrared irradiation is easily diffused in the substrate, and the temperature of the piezoelectric body does not rise and the obtained electromotive force is slight.

As described above, every one of pyroelectric-type, bolometer-type, and pseudo-pyroelectric-effect-type infrared-detecting elements and infrared image sensors using the elements, which are conventional techniques, has problems. With respect to the problems, many attempts have been made. However, every one of the attempts has both merits and demerits, and therefore, in the present situation, the above-described techniques has not been substituted.

SUMMARY OF THE INVENTION

According to an aspect of the invention, there is provided an infrared-detecting element including: a substrate; a laminated body having a lower electrode, an upper electrode, and a piezoelectric film made of aluminum nitride which is provided between the lower electrode and the upper electrode and in which a c-axis is oriented almost perpendicularly to a film plane; an anchor coupling a part of the laminated body with the substrate and supporting the laminated body with a gap above the substrate; and an amplifier provided on the substrate and connected to at least one of the lower electrode and the upper electrode, the amplifier having a circuit performing conversion into voltage according to a charge generated in the laminated body.

According to another aspect of the invention, there is provided an infrared image sensor in which a plurality of infrared-detecting elements are arranged in an array form, the infrared-detecting element including: a substrate; a laminated body having a lower electrode, an upper electrode, and a piezoelectric film made of aluminum nitride which is provided between the lower electrode and the upper electrode and in which a c-axis is oriented almost perpendicularly to a film plane; an anchor coupling a part of the laminated body with the substrate and supporting the laminated body with a gap above the substrate; and an amplifier provided on the substrate and connected to at least one of the lower electrode and the upper electrode.

According to another aspect of the invention, there is provided an infrared image sensor in which a plurality of infrared-detecting elements are arranged in an array form, the infrared-detecting element including: a substrate; a laminated body having a lower electrode, an upper electrode, and a piezoelectric film made of aluminum nitride which is provided between the lower electrode and the upper electrode and in which a c-axis is oriented almost perpendicularly to a film plane; an anchor coupling a part of the laminated body with the substrate and supporting the laminated body with a gap above the substrate; and an amplifier provided on the substrate and connected to at least one of the lower electrode and the upper electrode, wherein the amplifier including: a first transistor; a second transistor; a first terminal for applying voltage to a gate of the second transistor; a second terminal for applying voltage to a source of the second transistor; and a third terminal for getting voltage out of a drain of the first transistor, any one of the upper electrode and the lower electrode being connected to a gate of the first transistor, the other of the upper electrode and the lower electrode being earthed, the drain of the first transistor being connected to a drain of the second transistor and to the third terminal, a source of the first transistor being earthed, the gate of the second transistor being connected to the first terminal, and the source of the second transistor being connected to the second terminal.

DETAILED DESCRIPTION OF THE INVENTION

Hereinafter, with reference to drawings, embodiments of this invention will be explained.

First Embodiment

Figure 1:
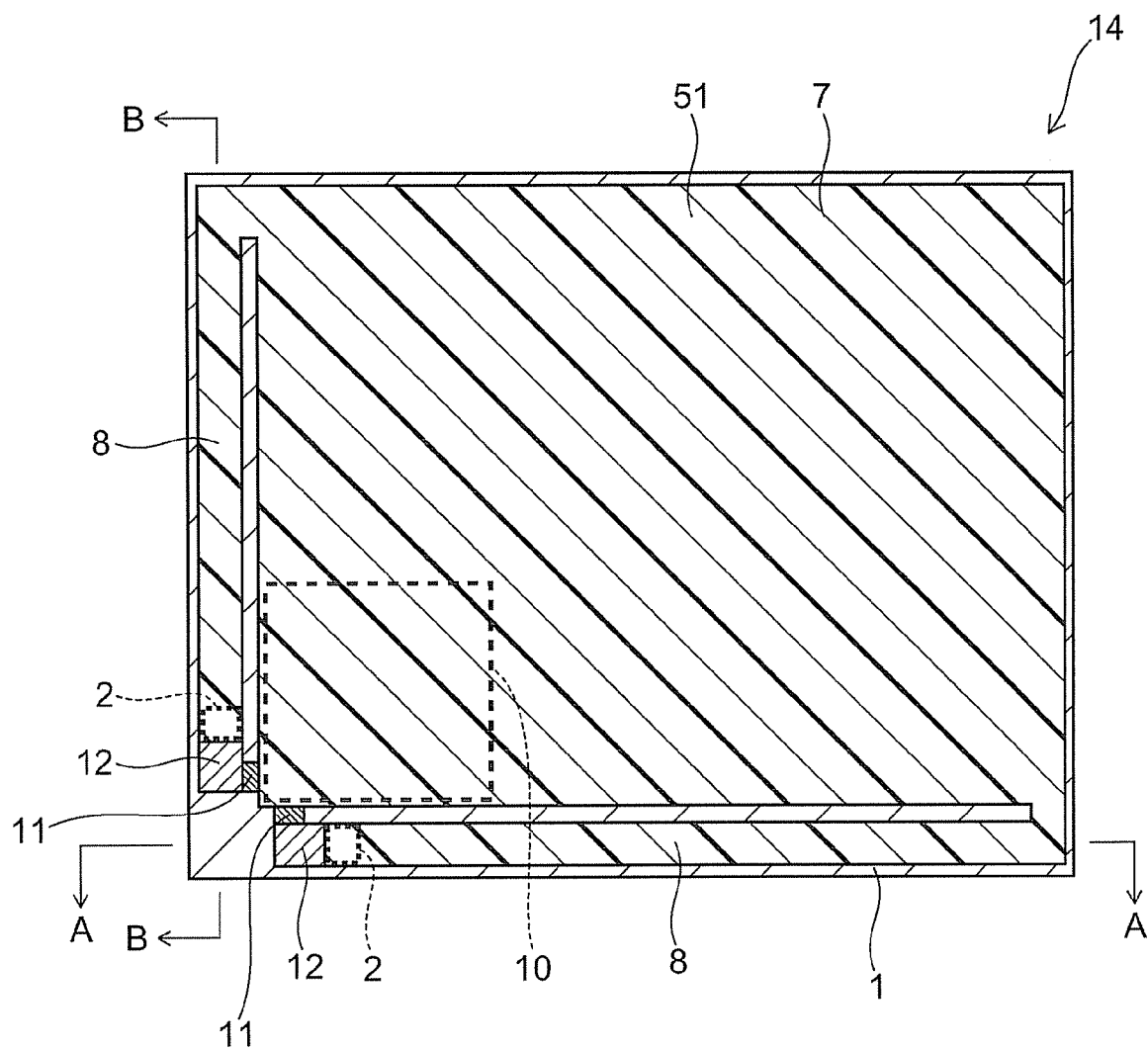
FIG. 1 is a plan view of an infrared-detecting element according to a first embodiment of this invention.
Figure 2A:
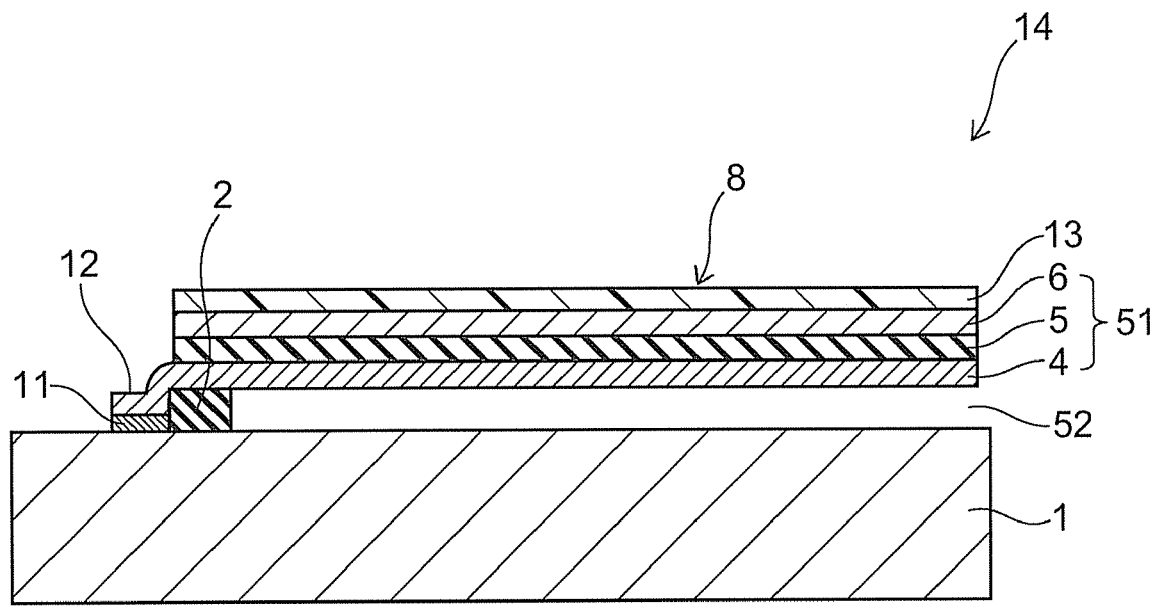
FIGS. 2A and 2B are partial section views of the infrared-detecting element according to the first embodiment of this invention.
Figure 2B:
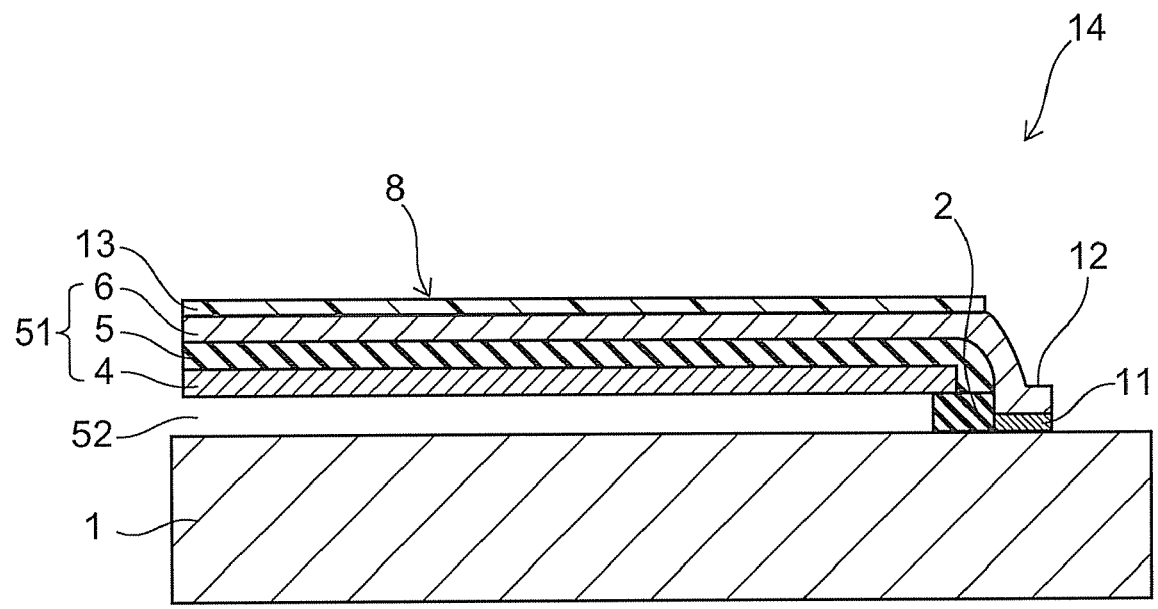

FIG. 1 is a plan view of an infrared-detecting element 14 according to a first embodiment. And, FIG. 2 is a partial section view of the infrared-detecting element according to the first embodiment, and FIGS. 2A and 2B are section views of A-A line and B-B line of FIG. 1, respectively.

As shown in FIGS. 1 and 2, an anchor 2 is formed on a substrate 1. A laminated body 51 is composed of a lower electrode 4, an upper electrode 6, and a piezoelectric film 5 sandwiched by the lower electrode 4 and the upper electrode 6. A connecting beam 8 that is an end of the laminated body 51 is coupled to the anchor 2, and the laminated body 51 is supported by the anchor 2 in the state with a gap 52 in an upper portion of the substrate 1. Moreover, amplifier 10 is formed on the substrate 1, and each of the lower electrode 4 and the upper electrode 6 is connected with a contact portion 12 to a interconnection 11 from the amplifier 10. Moreover, on the upper electrode 6, an infrared-absorbing layer 13 is provided and integrated with the laminated body 51, and thereby, a thermosensitive portion 7 is composed. The substrate 1 is made of silicon.

Moreover, the connecting beams 8 have a shape of strip. And, one connecting beam 8 extends to the crosswise direction in the drawing and the other connecting beam 8 extends to the lengthwise direction in the drawing. And, one end of each of the connecting beams 8 is coupled to the anchor 2 and extends from the anchor 2 within a parallel plane to the substrate 1 with a gap above the substrate 1, and the other end of the connecting beam 8 is coupled to the thermosensitive portion 7. In the infrared-detecting portion 14 according to this embodiment, the thermosensitive portion 7 and the connecting beams 8 are coupled in two corners on a diagonal line of the thermosensitive portion 7. However, as described later, in disposition or shape of the connecting beam 8 and coupling state with the thermosensitive portion 7, various modifications are possible.

That is, the infrared-detecting element 14 further includes the connecting beams 8 of stripe shape each having the piezoelectric film 5 provided between the thermosensitive portion 7 and the anchor 2, and the thermosensitive portion 7 is supported through the connecting beams 8 with a gap above the substrate 1.

Next, a process of producing the infrared-detecting element according to the first embodiment of this invention will be explained. FIGS. 3A-3D are section views showing steps of the process of producing the infrared-detecting element according to the first embodiment of this invention.

Figure 3A:
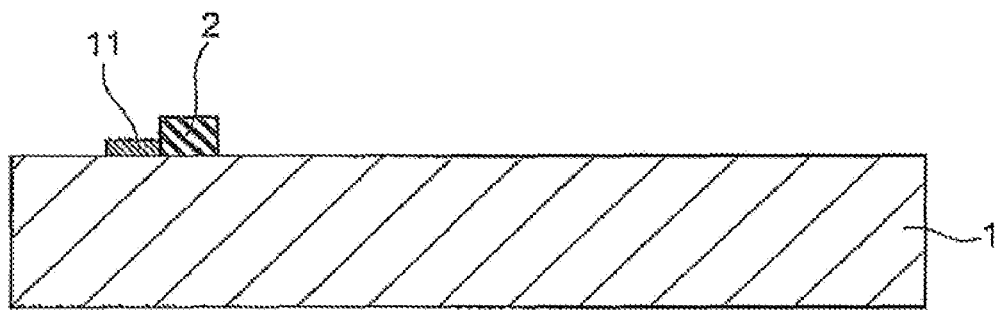
FIGS. 3A-3D are section views showing steps of the process of producing the infrared-detecting element according to the first embodiment of this invention.

First, as shown in FIG. 3A, the amplifier 10 (not shown), the interconnection 11, and the anchor 2 were produced on the substrate 1 made of silicon by CMOS process using a known method. As the interconnection 11, aluminum of a thickness of 0.5 µm was used, and silicon nitride or a thickness of 1 µm was used as the anchor 2.

Figure 3B:
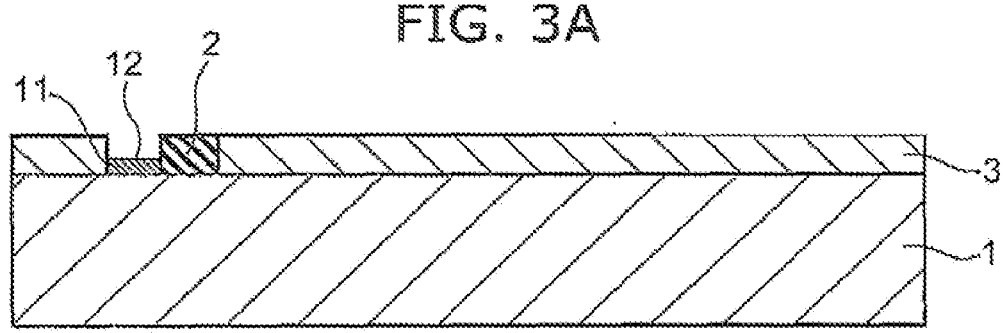

Next, as shown in FIG. 3B, a sacrificial film 3 made of amorphous silicon was formed on the substrate 1 by a sputtering method, and was flattened until an end of the anchor 2 came to be exposed by Chemical Mechanical Polishing (CMP) method. Furthermore, the contact portion 12 was formed by known lithography and etching, above the interconnection 11.

Figure 3C:
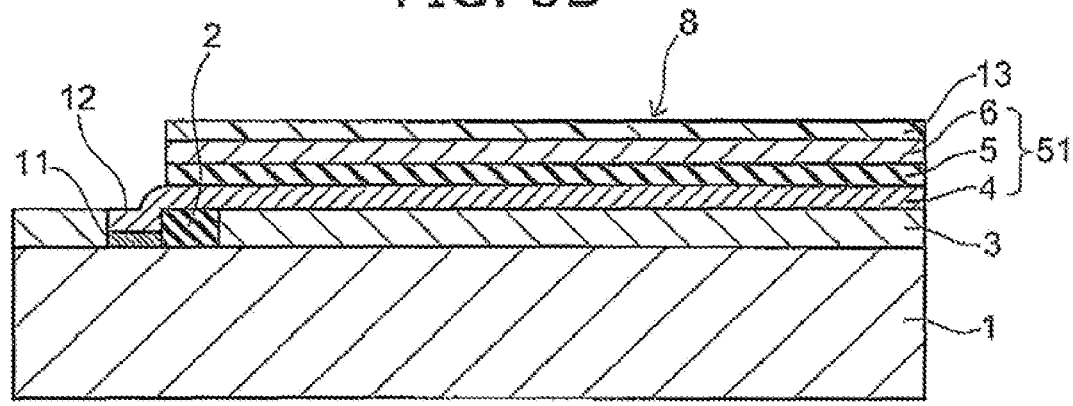

Next, as shown in FIG. 3C, the lower electrode 4 made of aluminum of a thickness of 2 μm, the piezoelectric film 5 made of aluminum nitride of a thickness of 1.2 μm, and the upper electrode 6 made of aluminum of a thickness of 2 μm, were formed by performing film-formation by sputtering and by patterning by etching, and thereby, the laminated body 51 was formed. Furthermore, an infrared-absorbing layer 13 made of polyimide of a thickness of 2 μm was formed by spin-coating, and thereby, the thermosensitive portion 7 was produced. Although not shown in the drawing, an amorphous layer made of aluminum-tantalum alloy of a thickness of 20 nm was formed beneath the lower electrode 4, and thereby, the lower electrode 4 and the upper electrode 6 was oriented at an orientation of [111], and the piezoelectric film 5 was strongly oriented at an orientation of [0001].

Figure 3D:
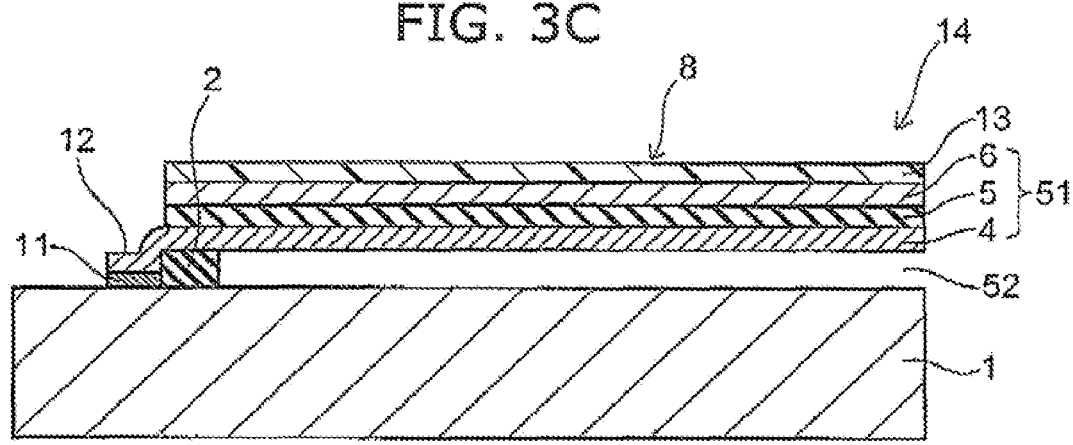

Next, as shown in FIG. 3D, the sacrificial film 3 made of amorphous silicon was selectively etched by vapor-phase etching using $XeF_2$ as an etchant, and the laminated body 51 was separated from the substrate 1, and thereby, the infrared-detecting element 14 was formed.

In the infrared-detecting element that was the first embodiment of this invention obtained as described above, orientations of the lower electrode 4 and the upper electrode 6 and the piezoelectric film 5 were measured by X-ray diffraction ω mode. As a result, it was confirmed that an orientation full width at half maximum (FWHM) in an orientation of [111] of aluminum derived from the lower electrode 4 and the upper electrode 6 was 0.9° and that an orientation full width at half maximum in an orientation of [0001] of aluminum nitride derived from the piezoelectric film 5 was 1.1°, which was oriented so well.

The infrared-detecting element of this invention exemplified by the first embodiment was found by the following technical investigation of the inventors.

That is, this invention was that a pyroelectric body was used as the detection element instead of a pyroelectric-type or bolometer-type infrared-detecting element and thereby, a new structure of the infrared-detecting element for detecting temperature rise by infrared irradiation through thermal strain and a material system used for the structure were found.

The inventors used the piezoelectric body as the detection element, and theoretically and experimentally considered the condition for producing the infrared-detecting element having good sensitivity with good reproducibility with regard to the infrared-detecting element detecting temperature increase caused by infrared irradiation via thermal strain, and therefore, the inventors found that at least the following conditions are satisfied.

Condition (A): In order that the temperature of the thermosensitive portion sufficiently rises when the infrared irradiation is received, a layer for absorbing infrared is required. However, an independent infrared-absorbing layer is not necessarily required. If infrared is irradiated to an electrode layer or a piezoelectric film or the like and infrared absorbances of the materials thereof are large, the materials can combine with the infrared-absorbing layer.

Condition (B): In order that the temperature rise rate of the thermosensitive portion is high and the temperature sufficiently rises when the infrared irradiation is received, it is necessary that the thermal capacity of the thermosensitive portion including the piezoelectric film is as small as possible, and it is necessary that the thermal capacity of the thermosensitive portion including the piezoelectric film is ten times or less, preferably, five times or less of the thermal capacity of the piezoelectric film.

Condition (C): In order that the temperature of the thermosensitive portion sufficiently rises when the infrared irradiation is received, such a structure that thermal insulation between the thermosensitive portion and the substrate becomes sufficiently large is required.

Condition (D): In order that when the infrared irradiation is received and the temperature of the thermosensitive rises, strain is sufficiently generated in the piezoelectric film, it is necessary that the piezoelectric film is bound to and in contact with a second material having a different thermal expansion coefficient from that of the piezoelectric film and that the thermal expansion coefficient of the second material is different from the piezoelectric film by $5\times10^{-6}$/K or more, and preferably, $10\times10^{-6}$/K or more. That is, when the second materials are the upper electrode 6 and the lower electrode 4, it is necessary that the difference between the linear expansion coefficient of the upper electrode 6 and the lower electrode 4 and the linear expansion coefficient of the piezoelectric film is $5\times10^{-6}$/K or more.

Condition (E): In order that when the infrared irradiation is received and the temperature of the thermosensitive rises, strain is sufficiently generated in the piezoelectric film and piezoelectric potential is generated, it is necessary that a ratio of stiffness of the piezoelectric film and a second material in contact with the piezoelectric film is from 0.1 to 10, preferably, from 0.2 to 5. That is, in the case that the second materials are the upper electrode 6 and the lower electrode 4, $(t_{TE} \cdot E_{TE} + t_{BE} \cdot E_{BE})/(t_P \cdot E_P)$ is from 0.1 to 10, desirably, from 0.2 to 5, where a thickness of the upper electrode 6 is $t_{TE}$, an in-film-plane longitudinal elasticity modulus of the upper electrode 6 is $E_{TE}$, a thickness of the lower electrode 4 is $t_{BE}$, an in-film-plane longitudinal elasticity modulus of the lower electrode 4 is $E_{BE}$, a thickness of the piezoelectric film 5 is $t_P$ and the in-film-plane longitudinal elasticity modulus of the piezoelectric film 5 is $E_P$.

Condition (F): In order that sufficient charge is induced when strain is generated in the piezoelectric film, it is necessary that (piezoelectric constant of the piezoelectric film/ relative permittivity) is large.

Condition (G): In order to read the charge induced in the piezoelectric film with good S/N ratio, it is necessary that standardization detection capacity is large.

Condition (H): In order to efficiently read imperceptible charge generated by the infrared irradiation, it is necessary that the thermoelectric portion having the piezoelectric film is produced at a temperature of 550° C. or less in order not to break the CMOS element, on a silicon substrate on which amplification circuits composed of CMOS element is preliminarily produced.

Condition (I): In order that sufficient charge is induced when strain is generated in the piezoelectric film, it is necessary that a piezoelectric axis of the piezoelectric film is oriented sufficiently to one way and that good-quality crystal having uniform polar character of polarization can be produced and that two electrodes are provided in the piezoelectric axis direction of the piezoelectric film.

The background that the above-described conditions are required will be specifically explained. Now, it is assumed that the piezoelectric film and the second materials are laminated and transformations of the in-plane direction are bound to each other. When longitudinal elasticity modulus, linear expansion coefficient, film thickness, and volumetric specific heat of the piezoelectric film are $E_p$, $\alpha_p$, $t_p$, and C'p respectively and longitudinal elasticity modulus, linear expansion coefficient, film thickness, and volumetric specific heat of the second materials are $E_m$, $\alpha_m$, $t_m$, and $C'_m$ respectively and piezoelectric coefficient of the piezoelectric film is $d_{31}$ and relative permittivity of the piezoelectric film is $\epsilon$, sensitivity Fv can be represented by the following formula.

$$Fv \sim E_p t_p E_m t_m/(E_p t_p + E_m t_m) \times C'pt_p/(C'pt_p + c'_m t_m) \times (\alpha_m \cdot \alpha_p) \times d_{31}/(C'p\epsilon)$$ (Mathematic Formula 1)

The second term of the right side of Mathematic formula 1 is a ratio of thermal capacities of the piezoelectric film and the thermosensitive portion composed of the piezoelectric film and the second materials. As the ratio is larger (as the ratio of the thermal capacities of the thermosensitive portion and the piezoelectric film is smaller), the sensitivity becomes higher. Therefore, the condition (B) is derived.

Moreover, the third term $(\alpha_m - \alpha_p)$ of the right side of Mathematic formula 1 is a difference between the linear expansion coefficients of the piezoelectric film and the second material, and the sensitivity is proportional to the difference, and therefore, as the difference is larger, the sensitivity is better. Therefore, the condition (D) is derived.

Furthermore, from the first term of the right side of Mathematic formula 1, in order to make the sensitivity largest, it is found to be desirable that the longitudinal stiffness $E_p t_p$, which is a product of longitudinal elasticity modulus and film-thickness of the piezoelectric film, is substantially equal to the longitudinal stiffness $E_m t_m$, which is a product of the piezoelectric material. Specifically, it is necessary that a ratio of the longitudinal stiffnesses of the piezoelectric film and the second material is at least from 0.1 to 10, preferably, from 0.2 to 5. That is, in the case that the second materials are the upper electrode 6 and the lower electrode 4, $(t_{TE} \cdot E_{TE} + t_{BE} \cdot E_{BE})/(t_p \cdot E_p)$ is from 0.1 to 10, preferably, from 0.2 to 5. Therefore, the condition (E) is derived, where a thickness of the upper electrode 6 is $t_{TE}$, an in-film-plane longitudinal elasticity modulus of the upper electrode 6 is $E_{TE}$, a thickness of the lower electrode 4 is $t_{BE}$, an in-film-plane longitudinal elasticity modulus of the lower electrode 4 is $E_{BE}$, a thickness of the piezoelectric film 5 is $t_P$ and the in-film-plane longitudinal elasticity modulus of the piezoelectric film 5 is $E_P$.

Moreover, from the four term of the right side of Mathematic formula 1, $d_{31}/(C'p\epsilon)$ relates to the sensitivity of the piezoelectric film, and therefore, the condition (F) is derived.

On the other hand, when the charge induced in the piezoelectric film is read by using an external circuit, S/N ratio presents a problem. The largest noise is a noise that is generally called as Johnson Noise. Dielectric loss (tan δ) of the piezoelectric film relates thereto. Standardization detection capacity $F_D$ considering the S/N ratio can be represented by the following formula.

$$F_D \sim d_{31}/\{C'p(\epsilon \cdot \tan \delta)^{1/2}\}$$ (Mathematic Formula 2)

From Mathematic formula 2, the condition (G) is derived.

Furthermore, in order to efficiently read imperceptible charge generated by the infrared irradiation, the condition (H) is derived. And, in order that sufficient charge is induced when strain is generated in the piezoelectric film, the condition (I) is derived.

In the infrared-detecting element disclosed in the above-described Japanese Patent No. 3311869 does not satisfy the conditions of A, B, and H and does not have specific description of E, G, and therefore, mechanics satisfying the conditions of E and G has not been disclosed.

The present invention has been achieved for satisfying the above-described conditions (A)~(I).

Hereinafter, it will be explained that a first embodiment of this invention applies to the above-described (A)~(I).

The condition (A) will be described. In the infrared-detecting element exemplified in the first embodiment, the lower electrode 4 and the upper electrode 6 that are made of aluminum, the laminated 51 composed of the piezoelectric film 5 made of aluminum nitride absorbs infrared, and the temperature thereof can rise. Furthermore, in the first embodiment, the infrared-absorbing layer 13 made of polyimide is formed on the laminated body 51, and the thermosensitive portion 7 can efficiently absorb to convert infrared to heat. As described above, the infrared-detecting element exemplified in the first embodiment satisfies the condition (A), the temperature of the thermosensitive portion can be made to sufficiently rise by the infrared irradiation to the thermosensitive portion.

The condition (B) will be described. The thermosensitive portion 7 includes the piezoelectric film 5, the laminated body 51 composed of the lower electrode 4 and the upper electrode 6 sandwiching the piezoelectric film 5, and the infrared-absorbing layer 13. These are not in contact with the substrate 1 or the like, which has large thermal capacity. In the first embodiment, the specific heat of the aluminum nitride forming the piezoelectric film 5 is 8.0 cal/molK, and the specific heat of the aluminum forming the lower electrode 4 and the upper electrode 6 is 5.8 cal/molK, the specific heat of polyimide forming the infrared-absorbing layer 13 is about 2 cal/molK although depending on the composition and so forth. The thermal capacity of the thermosensitive portion 7 can be suppressed to be about three time of the thermal capacity of the piezoelectric film 5. As described above, the infrared-detecting element exemplified in the first embodiment satisfies the condition (B), the temperature of the thermosensitive portion can be made to sufficiently rise at a high rate of temperature rise by the infrared irradiation to the thermosensitive portion.

The condition (C) will be described. The laminated body 51 is supported in air above the substrate 1 by the anchor 2 connected to the laminated body. An end of the above-described laminated body 51 is connected to the anchor 2 above the substrate by the long slim connecting beam 8. As described above, the infrared-detecting element exemplified in the first embodiment satisfies the condition (C), thermal conductivity to the substrate 1 can be sufficiently small, and the temperature of the thermosensitive portion can be made to sufficiently rise by the infrared irradiation to the thermosensitive portion.

The condition (D) will be described. The piezoelectric film 5 including the thermosensitive portion 7 is sandwiched by the lower electrode 4 and the upper electrode 6, and the transformation in the in-plane direction is bound. Therefore, by the difference of the thermal expansion coefficients of the piezoelectric film 5 and (the lower electrode 4 and the upper electrode 6), thermal stress can be generated. Specifically, when c-axis of the aluminum nitride is oriented in the perpendicular direction to the film surface, linear expansion coefficient of in-plane direction is $5.27 \times 10^{-6}$/K, and linear expansion coefficient of the aluminum used as the lower electrode 4 and the upper electrode 6 is $23 \times 10^{-6}$/K, and therefore, the linear expansion coefficients are very different, and sufficient thermal strain can be generated. As described above, the infrared-detecting element exemplified in the first embodiment satisfies the condition (D), sufficiently large strain can be generated in the piezoelectric film of the thermosensitive portion by the infrared irradiation to the thermosensitive portion.

The material used in the lower electrode 4 and the upper electrode 6 is not limited to aluminum but an electrode material having a different linear expansion coefficient from a linear expansion coefficient of the piezoelectric film at least by $5\times10^{-6}$/K or more, and preferably, $10\times10^{-6}$/K or more can be used. For example, the linear expansion coefficient of copper is $16.7\times10^{-6}$/K and the linear expansion coefficient of the in-plane direction of aluminum nitride is $5.27\times10^{-6}$/K and therefore the difference between the linear expansion coefficients is large and copper is suitable for the electrode material. In the Japanese Patent No. 3311869, although an aluminum nitride piezoelectric film is structurally fixed to a silicon substrate, the linear expansion coefficient of silicon is $2.5\times10^{-6}$/K and is near to the value of the linear expansion coefficient of aluminum nitride. Accordingly, by the structure described in the Japanese Patent No. 3311869, a large thermal strain cannot be induced.

The condition (E) will be described. Longitudinal elasticity modulus in the perpendicular direction to the c-axis of the aluminum nitride used as the piezoelectric film 5 is $3.95\times10^{11}$ Pa, and therefore, the longitudinal elasticity modulus of the piezoelectric film 5 is $E_P=3.95\times10^{11}$ Pa. Moreover, the longitudinal elasticity modulus is $7.2\times10^{10}$ Pa, and therefore, the longitudinal elasticity modulus $E_{BE}$ of the lower electrode 4 and the longitudinal elasticity modulus $E_{TE}$ of the upper electrode 6 are both $7.2\times10^{10}$ Pa (elasticity modulus of polyimide is small and therefore here ignored). Moreover, thickness $t_p$ of the piezoelectric film 5 is 1.2 μm and the thickness of the lower electrode 4 is $t_{BE}$ and the thickness $t_{TE}$ of the upper electrode 6 are both 2.0 μm. Therefore, the ratio of the longitudinal stiffness of (the lower electrode 4 and the upper electrode 6) and the piezoelectric film 5 $(t_{TE}\cdot E_{TE}+t_{BE}\cdot E_{BE})/(t_P\cdot E_P)$ is about 1.6. As described above, the infrared-detecting element exemplified in the first embodiment satisfies the condition (E), a large piezoelectric effect by thermal stress is generated.

The condition (F) will be described. In the infrared-detecting element exemplified in the first embodiment, when the reading circuit is actually connected, the sensitivity is determined by the ratio of the piezoelectric coefficient $d_{31}$ and (the volumetric specific heat C'p and the relative permittivity $\in$) $d_{31}/(C'p\epsilon)$. In the infrared-detecting element exemplified in the first embodiment, the piezoelectric coefficient $d_{31}$ with respect to the stress of the perpendicular direction to the c-axis of aluminum nitride forming the piezoelectric film 5 is $-3.1$ C/N, and the volumetric specific heat C'p is 8.0 cal/molK, and the relative permittivity $\epsilon$ is about 10. Therefore, $d_{31}/(C'p\epsilon)$ becomes $-0.10$ CKcm$^3$/NJ, which is a large value. As described above, the infrared-detecting element exemplified in the first embodiment satisfies the condition (F), sufficient charge is induced when strain is generated in the piezoelectric film.

In the infrared-detecting element exemplified in the first embodiment, the piezoelectric coefficient $d_{31}$ is $-3.1$ C/N, which is smaller than that of a ferroelectric material such as a PZT by one digit or more and seems not suitable for the piezoelectric film of the infrared-detecting element at a glance. However, as described above, when the reading circuit is actually connected, the sensitivity is determined by the ratio of the piezoelectric coefficient $d_{31}$ and (the volumetric specific heat C'p and the relative permittivity $\epsilon$) $d_{31}/(C'p\epsilon)$, and the permittivity of the aluminum nitride is about 10, which is smaller than that of a ferroelectric material, and therefore, $d_{31}/(C'p\epsilon)$ can be made to be sufficiently large.

The condition (G) will be described. As described in the mathematic formula 2, standardization detection capacity $F_D$ considering the S/N ratio in reading can be represented by $d_{31}/\{C'p(\epsilon\cdot\tan \delta)^{1/2}\}$. Here, as well as the above-described detection sensitivity, the dielectric loss tan δ presents a problem. In the infrared-detecting element exemplified in the first embodiment, the dielectric loss tan δ of aluminum nitride used in the piezoelectric film 5 is very small, which is generally 0.005 or less and detection sensitivity or less by general measurement. Accordingly, standardization detection capacity $d_{31}/\{C'p(\epsilon\cdot\tan \delta)^{1/2}\}$ can be made to be very large. As described above, the infrared-detecting element exemplified in the first embodiment satisfies the condition (G), the S/N ratio can be made to be large, and charge induced in the piezoelectric film can be read with good sensitivity.

The condition (H) will be described. In the infrared-detecting element exemplified in the first embodiment, the aluminum nitride forming the piezoelectric film 5 has very good compatibility with a CMOS process. By the aluminum nitride film, a film with insulating property can be easily formed on a silicon substrate at room temperature or at a low temperature of about 100° C., and an easily-oxidizable metal such as aluminum having good CMOS compatibility can be used as the lower electrode 4 and the upper electrode 6. As described above, the infrared-detecting element exemplified in the first embodiment satisfies the condition (H), and can be produced on a silicon substrate on which amplification circuits composed of the CMOS element are preliminarily produced, and the imperceptible charge generated by the infrared irradiation can be efficiently read.

The condition (I) will be described. In the infrared-detecting element exemplified in the first embodiment, an orientation full width at half maximum (FWHM) of an orientation of [111] of Al derived from the lower electrode 4 and the upper electrode 6 is 0.9°, an orientation full width at half maximum of an orientation of [0001] of AlN derived from the piezoelectric film 5 is 1.1°. A highly oriented film could be formed. Moreover, with respect to the piezoelectric characteristics, a theoretical value (value measured in single crystal) was obtained, and thereby, it was assumed that the polarity was uniform in the same direction. Furthermore, the c-axis, which is piezoelectric axis, is perpendicular to the piezoelectric film, and electrodes are formed above and below. As described above, the infrared-detecting element exemplified in the first embodiment satisfies the condition (I), sufficient charge is efficiently induced so as to be detected when the strain is generated in the piezoelectric film 5.

As described above, the infrared-detecting element of this invention exemplified in the first embodiment satisfies the above-described conditions (A)~(I).

The infrared-detecting element according to the first embodiment produced as described above was combined with an amplifier shown in a third embodiment as described later and was applied to an infrared image sensor exemplified in a fourth embodiment, and thereby, it was confirmed that NETD index (noise equivalent temperature difference), which represents detection performance of infrared, was 0.07° C., which is very highly accurate.

The infrared-detecting element 14 further includes a stripe-shaped connecting beam 8 provided between the thermosensitive portion 7 and the anchor 2, and the thermosensitive portion 7 is supported through connecting beam 8 with a gap above the substrate 1. Thereby, as described previously, the thermal conduction to the substrate 1 can be sufficiently small, and the temperature of the thermosensitive portion can be made to sufficiently rise. Furthermore, the arrangement places of two contact portions 12 can be approximated, and the connecting distance to the amplifier 10 can be shorten.

Thereby, noise can be suppressed and imperceptible charge generated by the infrared irradiation can be efficiently read.

Second Embodiment

Next, the infrared-detecting element according to a second embodiment of this invention will be explained.

Figure 4:
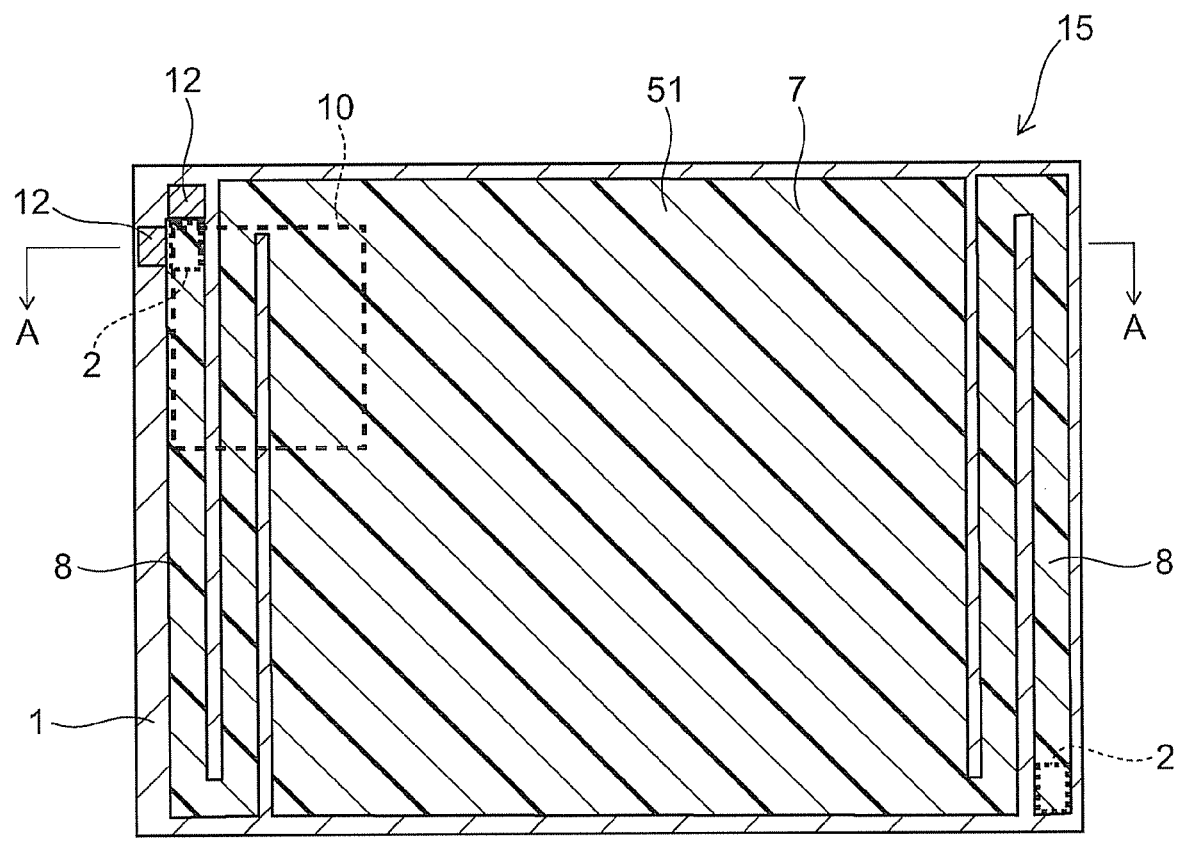
FIG. 4 is a plan view of an infrared-detecting element according to a second embodiment of this invention.
Figure 5:
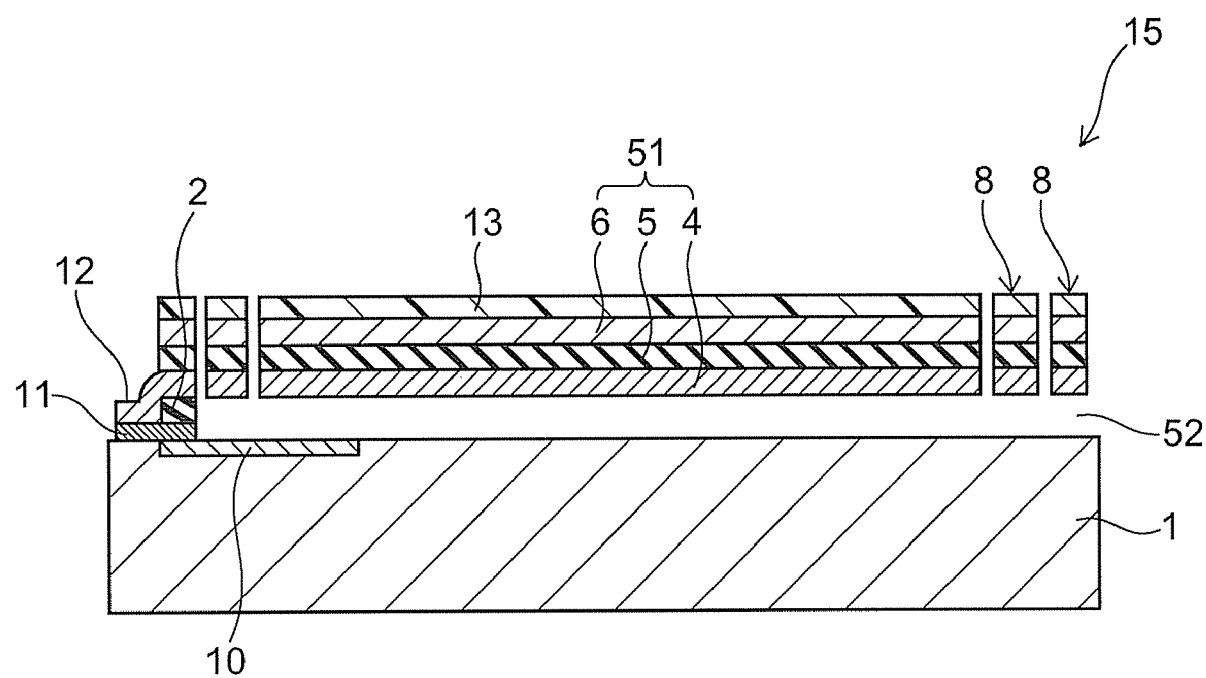
FIG. 5 is a section view of the infrared-detecting element according to the second embodiment of this invention.

FIG. 4 is a plan view of the infrared-detecting element 15 according to a second embodiment of this invention. Moreover, FIG. 5 is a section view of A-A section view. The laminated body 51 and the thermosensitive portion 7 have a cantilever beam structure for the first embodiment but have a center impeller beam structure for the second embodiment. The same numbers are appended to the components having the same roles as the first embodiment will be explained.

As shown in FIGS. 4 and 5, the anchors 2 are formed at two places on the substrate 1. The laminated body 51 is composed of the lower electrode 4, the upper electrode 6, and the piezoelectric film 5 sandwiched by the lower electrode 4 and the upper electrode 6. The portions of connecting beams 8 of right and left ends of the laminated body 51 are connected to the anchors 2, and the laminated body 51 is supported by the anchors 2 in the state with the gap 52 above the substrate 1. The amplifier 10 is formed on the substrate 1, and the lower electrode 4 and the upper electrode 6 are connected to the interconnection 11 from the amplifier 10 at the contact portion 12. The infrared-absorbing layer 13 is formed on the laminated body 51 and integrated with the laminated body 51, and thereby, the thermosensitive portion 7 is composed.

That is, in the infrared-detecting element 15, the connecting beam 8 has a folded and stripe-shaped structure. Thereby, the thermal conductivity to the substrate 1 can be sufficiently small, and by infrared irradiation to the thermosensitive portion, the temperature of the thermosensitive portion can be made to sufficiently rise.

And, the anchor 2 is provided outside each of the two opposed side faces of the thermosensitive portion 7, and the anchors 2 are separated so as to sandwich the thermosensitive portion 7 in a parallel plane to the substrate 1. That is, the laminated body 51 is supported above the substrate 1 by the plurality of the anchors 2 provided so as to sandwich the thermosensitive portion 7 in a parallel plane to a layer of the laminated body 51. That is, the laminated body 51 has a cantilever beam structure in the infrared-detecting element 14 exemplified in FIG. 1, but has a center impeller beam structure in the infrared-detecting element 15.

As described above, in the second embodiment, the laminated body 51 has a center impeller beam structure, and thereby, the laminated body 51 can be supported stably with a gap 52 above the substrate 1. Moreover, it goes without saying that the embodiment satisfies the conditions (A)~(I).

Hereinafter, for comparing the infrared-detecting element of this invention, infrared-detecting elements according to comparative examples will be described.

First Comparative Example

First, a pyroelectric-type infrared-detecting element that is a first comparative example will be explained. FIGS. 6A-6E are section views in the respective steps of the process of producing the pyroelectric-type infrared-detecting element that is the first comparative example.

Figure 6A:
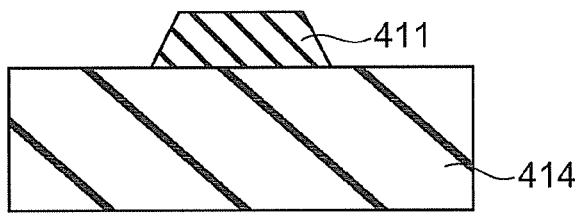
FIGS. 6A-6E are section views in the respective steps of the process of producing an infrared-detecting element of a first comparative example.

As shown in FIG. 6A, a pyroelectric body film 411 of a singly oriented lead titanate was formed on a single crystal substrate 414 of MgO or the like, and processed in an element form by lithography and etching.

Figure 6B:
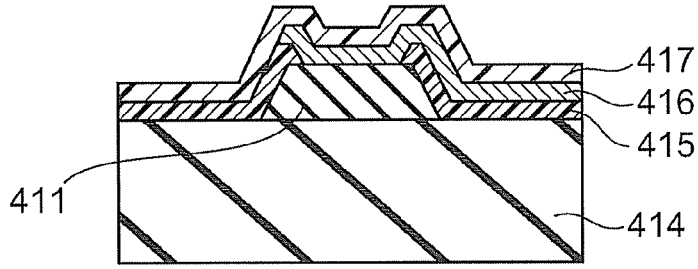

Next, as shown in FIG. 6B, a first resin film 415, a first electrode 416, and a second resin film 417 were formed.

Figure 6C:
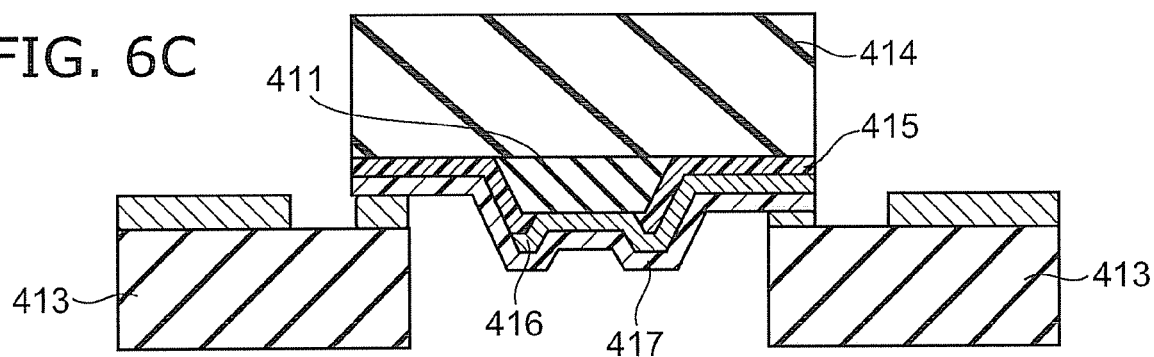

Next, as shown in FIG. 6C, a single crystal substrate 414 on which the pyroelectric body 411 is formed is made to adhere to a ceramic substrate 413 in which alumina or the like is used, through a resin film, using an adhesive layer.

Figure 6D:
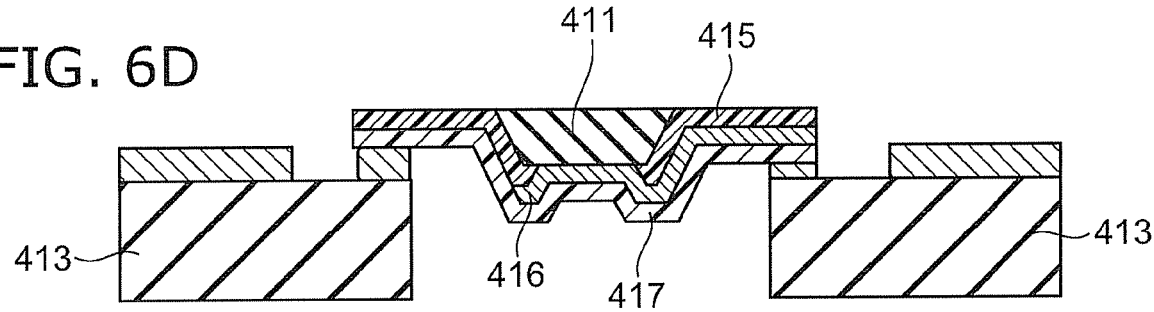

Next, as shown in FIG. 6D, the single crystal substrate 414 was dissolved and removed.

Figure 6E:
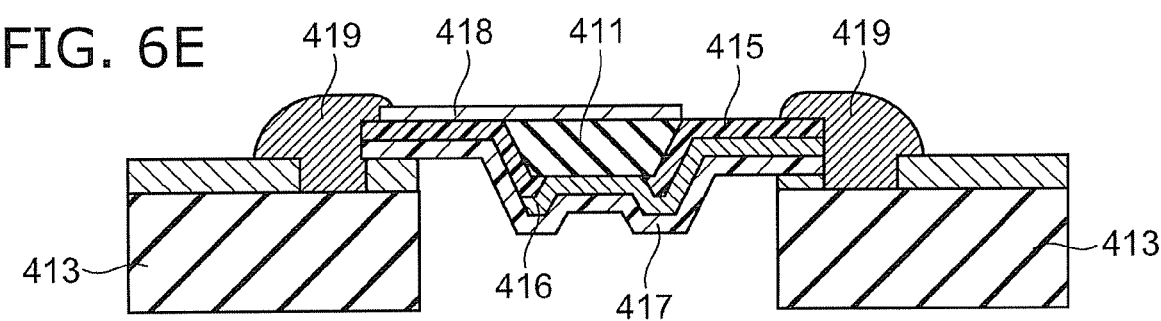

Next, as shown in FIG. 6E, the second electrode 418 combining with a light-receiving electrode was formed. Moreover, a not-shown amplifier 404 is separately attached to the ceramic substrate 413, and an interconnection 421 from the amplifier 404 and a first electrode 416 and a second electrode 418 that are detection elements were connected by a conductive paste 419.

In the infrared-detecting element of the first comparative example produced as described above, the amplifier is provided on another substrate, and therefore, noise is large and detection accuracy is bad. Moreover, the complicated steps of bonding and of dissolving and removing the substrate are included in the production of the detecting element, and therefore, reliability and accuracy is bad, and microfabrication is difficult.

Second Comparative Example

Next, an infrared-detecting element that is a second comparative example will be explained.

In the infrared-detecting element having a structure shown in FIGS. 1 and 2, it was attempt to produce the element with replacing the material used in the piezoelectric film 5 by a PZT piezoelectric film. There was produced the laminated body in which $Pb(Zr_{0.48}Ti_{0.52})O_3$ was used as the piezoelectric film 5 and Pt was used as the lower electrode 4 and the upper electrode 6 and $SiN/SiO_2$ was used as the infrared-absorbing film 13. The film thickness is the same as the case of the infrared-detecting element of the first embodiment. However, a sol-gel method is used in the film formation of the piezoelectric film, and crystallization heat treatment at 600° C. for 3 minutes was performed before sacrificial-film-selecting etching treatment, and furthermore, polarizing treatment was performed.

When the infrared-detecting element of the second comparative example produced as described above was observed by an optical microscope, the laminated body is largely transformed to be in contact with the substrate, and it was found that a suitable infrared-detecting element cannot be formed. The cause was that the piezoelectric film largely contracts and transforms in the crystallization heat treatment. That is, in the second comparative example, the insulation between the thermosensitive portion and the substrate, namely the condition (C), was very bad, and therefore, the temperature of the thermosensitive portion does not rise by infrared irradiation, a suitable infrared sensor cannot be composed irrespective of whether the other conditions (A), (B) and the conditions (D)~(E) are satisfied or not.

Third Comparative Example

Figure 7:
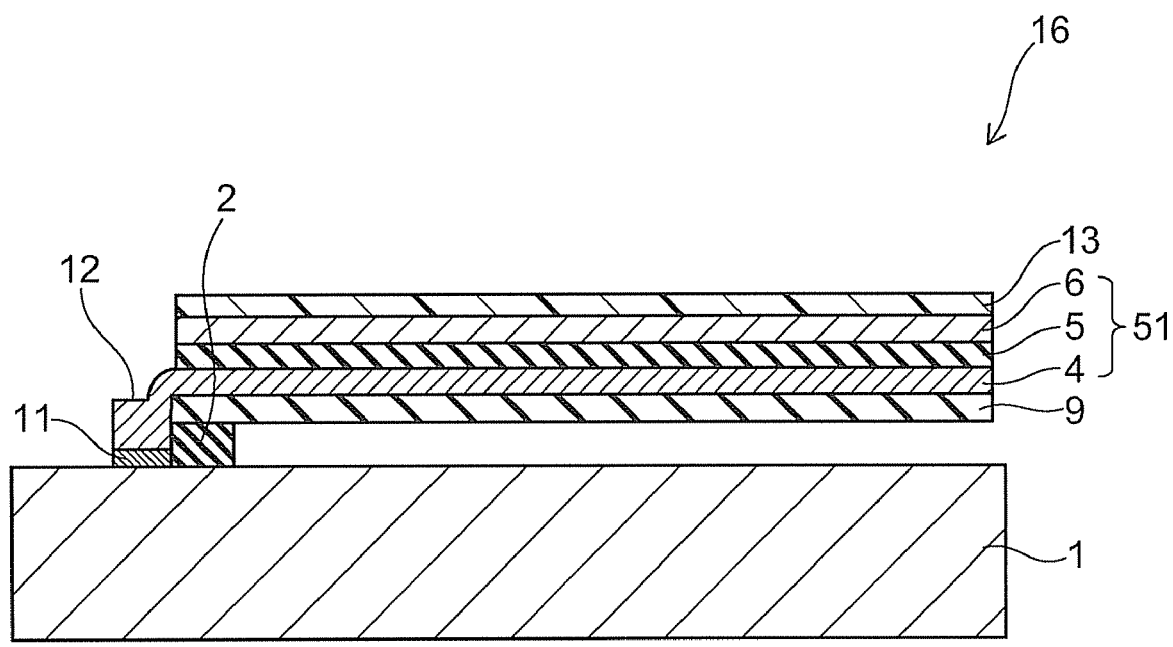
FIG. 7 is a section view of an infrared-detecting element of a third comparative example.

Next, an infrared-detecting element that is a third comparative example will be explained. FIG. 7 is a section view of the infrared-detecting element of the third comparative example. Because the infrared-detecting element could not be formed suitably by transformation of the piezoelectric film, the laminated body 51 was produced on a support layer 9 made of SiN as shown in FIG. 7 in the third comparative example. The thickness of the support layer 9 is 5 μm. All structures and processes except the support substrate 9 are the same as the second comparative example. When the element was observed by an optical microscope after produced, the portion of the laminated body 51 transformed largely upward but was not in contact with the substrate, and therefore, the infrared-detecting element was barely formed.

As described above, in the case that PZT exemplified in the second and third comparative examples was used as the piezoelectric film 5, the film has a characteristic of having a large piezoelectric coefficient, and as a result of measuring the piezoelectric coefficient and the permittivity, the piezoelectric coefficient d31 was 20 times larger than that of −61 C/N and aluminum nitride. However, the relative permittivity ∈ was also 150, which is large, and therefore, the $d_{31}/(C'p\epsilon)$ of the above-described condition (F) became −0.14 CKcm$^3$/NJ, and was only 1.5 times larger than the aluminum nitride. On the other hand, tan δ of PZT was 0.07 and was ten times or more larger than that of aluminum nitride, and therefore, the value $d_{31}/\{C'p(\epsilon \cdot \tan \delta)^{1/2}\}$, which is the above-described condition (G), became much smaller than that of the case of the first embodiment.

Accordingly, the second and third comparative examples satisfy the condition (F) but do not satisfy the condition (G) and do not satisfy the condition (H), either. Moreover, the third comparative example satisfies the conditions (A)~(F) and (I). However, the condition (G) is not satisfied as described above, and also, the condition (H) is not satisfied because the process temperature is more than 550° C., which is allowable temperature limit of CMOS.

The infrared-detecting element of the third comparative example was combined with the amplifier shown in the third embodiment to be described later, and applied to an infrared image sensor exemplified in the fourth embodiment, and therefore, NETD index representing detection performance of infrared was 0.23° C., which was ⅓ or less of the cases of the first and second embodiments in which aluminum nitride was used as the piezoelectric film 5.

As described above, as exemplified in the first to third comparative examples, in the infrared-detecting elements of the comparative examples, it has not been possible to realize the infrared-detecting element that can be produced on a chip on a silicon substrate and that has high sensitivity, high accuracy, and high reliability.

Third Embodiment

Next, an infrared-detecting element of a third embodiment of this invention will be explained.

Figure 8:
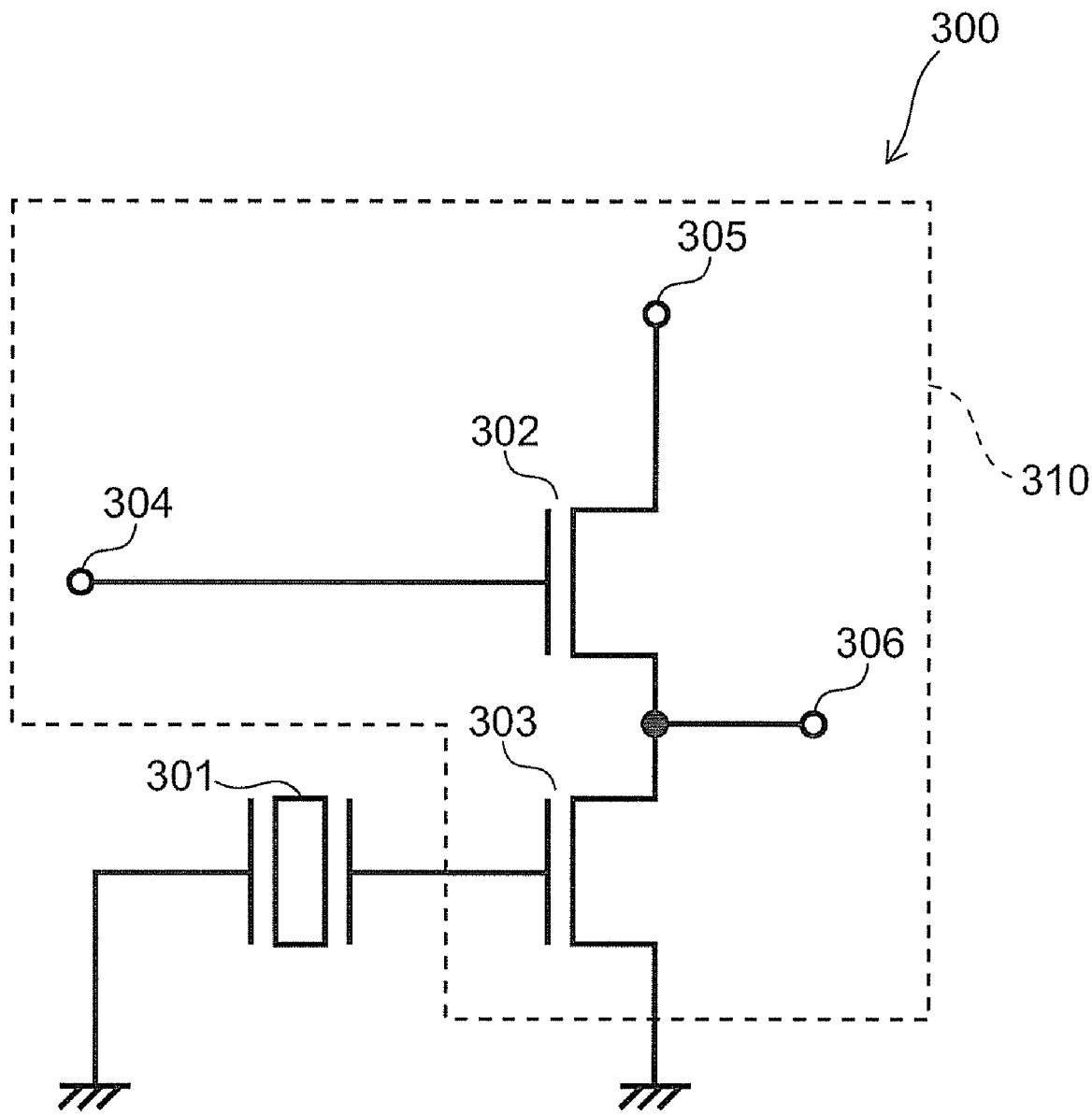
FIG. 8 is a circuit view showing a circuit structure of an infrared-detecting element according to a third embodiment of this invention.

FIG. 8 is a circuit view showing a circuit structure of the infrared-detecting element according to the third embodiment. As shown in FIG. 8, in the infrared-detecting element 300 of the third embodiment, the amplifier 310 is connected to the laminated body 301, and includes a first transistor 303 for converting the charge generated in the laminated body 301 into voltage, a second transistor (load transistor) 302 connected to the first transistor 303, a first terminal 304 for applying voltage to a gate of the second transistor 302, a second terminal 305 for applying voltage to source of the second transistor 302, and a third terminal 306 for getting charge information from drain of the first transistor 303. As shown in FIG. 8, in the infrared-detecting element 300 of the third embodiment, the amplifier formed on the substrate has a circuit for converting information of charge generated in the laminated body 301 into voltage information.

One out of the upper electrode 6 and the lower electrode 4 of the laminated body is connected to the gate of the first transistor, and the other electrode of the upper electrode 6 and the lower electrode 4 is earthed, and the drain of the first transistor 303 is connected to the drain of the second transistor 302 and to the third terminal 306, and the source of the first transistor 303 is earthed. The gate of the second transistor 302 is connected to the first terminal 304, and the source of the second transistor 302 is connected to the second terminal 305, and the drain of the second transistor 302 is connected to the drain of the first transistor 303 and to the third terminal 306. As described above, the amplifier 310 of the infrared-detecting element that is the third embodiment of this invention forms the source-earthed amplification circuit.

The first terminal 304 and the second terminal 305 has constant voltage, and the second transistor 302 comes to function as a load resistance. By such a circuit structure, charge generated in the laminated body 301 is input into the gate of the first transistor 303, and the voltage according to the generated charge amount is output in the third terminal 306, and thereby, the charge information of the laminated body 301 can be converted into voltage information.

When the charge information of the laminated body 301 is converted into the voltage information, the charge generated in the laminated body 301 is converted into voltage information, nondestructively. Therefore, after the conversion, operation of returning the charge information of the laminated body 301 to the initial state is not required.

In the infrared-detecting element 300 of the third embodiment, for example, the charge information involved with the temperature change of 5 mK of the laminated body 301 is output as voltage change of 0.1 V in the third terminal 306.

In the infrared-detecting element 300 of the third embodiment, it is desirable that parasitic capacity of the interconnection connecting a terminal of the laminated body 301 (the upper electrode or the lower electrode) with the gate of the first transistor 303 is reduced as much as possible in order to efficiently conduct the information of the charge generated in the laminated body 301.

In order to suppress bad influence to characteristics due to residual charge or the like such as the interconnection connecting the image sensor element 301 and the gate of the first transistor 303, the switch for earthing the interconnection may be provided between the interconnection and the ground. That is, the amplifier 310 may further include the switch that is provided between the gate of the first transistor 303 and the earth terminal and that enables the gate of the first transistor 303 to be earthed.

Fourth Embodiment

Next, an infrared image sensor according to a fourth embodiment of this invention will be explained using drawings.

Figure 9:
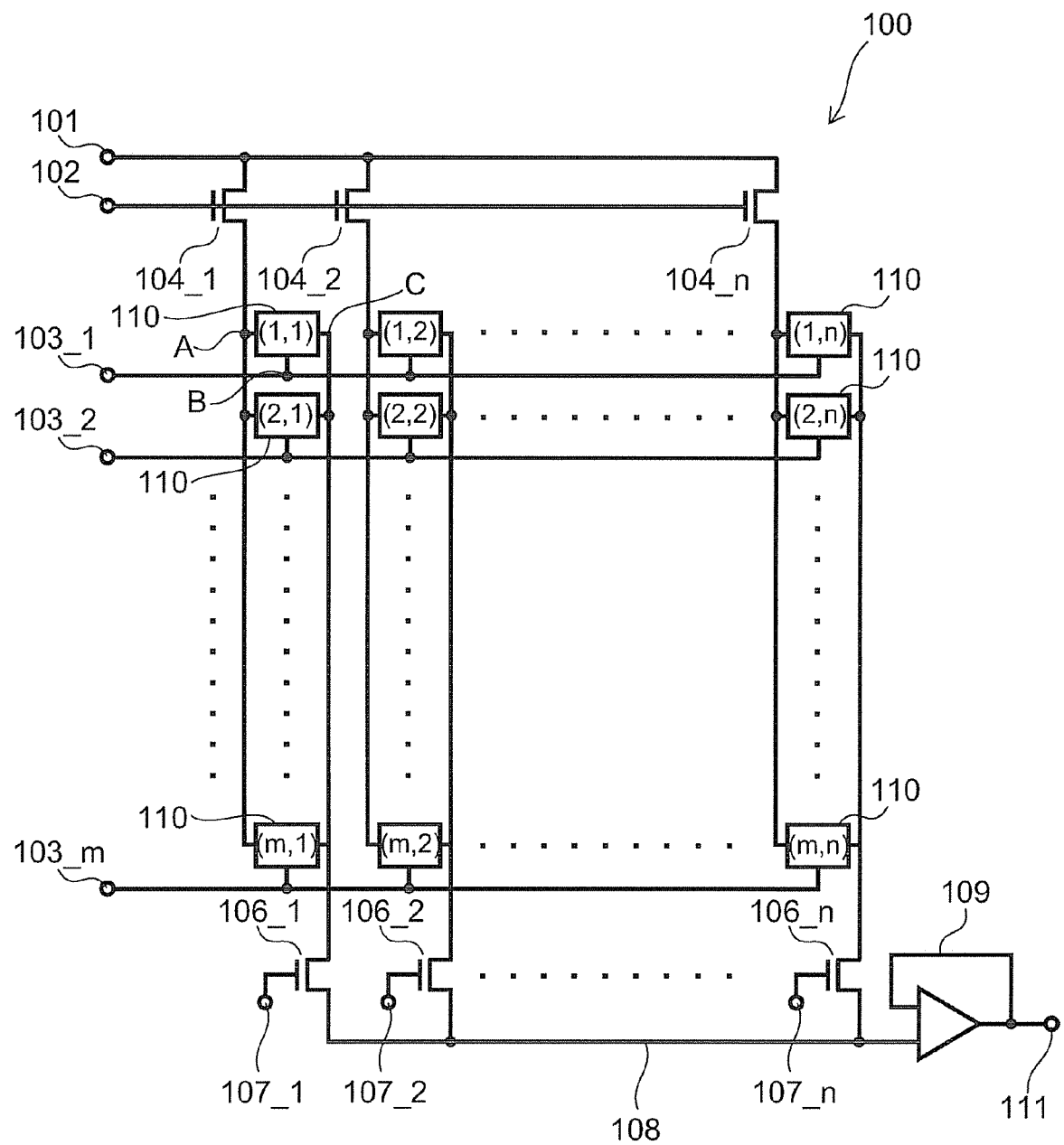
FIG. 9 is a circuit view showing a circuit structure of an infrared image sensor according to a fourth embodiment of this invention of this invention.

FIG. 9 is a circuit view showing a circuit structure of the infrared image sensor according to the fourth embodiment of this invention.

In the fourth embodiment, the infrared-detecting elements 300 of the third embodiment are arranged in an array form of n×m. Thereby, input infrared image information can be converted into voltage information.

The infrared image sensor 100 according to the fourth embodiment includes n×m infrared image sensor components (infrared-detecting elements) 110, a load transistor group of 104_1, 104_2, . . . , 104_n that are arranged in each row of the infrared image sensor components 110, a terminal 101 for applying voltage to each source of the load transistor group of 104_1, 104_2, . . . , 104_n, a terminal 102 for applying voltage to each gate of the load transistor group of 104_1, 104_2, . . . , 104_n, a terminal group of 103_1, 103_

2, ..., 103_m that select column components of the infrared image sensor components 110, a switching transistor group of 106_1, 106_2, ..., 106_n that select row components of the infrared image sensor components 110, a terminal group 107_1, 107_2, ..., 107_n for applying voltage to each gate of the switching transistor group of 106_1, 106_2, ..., 106_n, an image output line 108 for outputting a voltage signal of each of the infrared image sensor components 110, a buffer amplifier 109, and an image output terminal 111.

Moreover, terminal A, terminal B, and terminal C are connected to each of the infrared image sensor components 110.

The drain of the load transistor 104_1 is connected to the terminals A of (1,1) component, (2,1) component, ..., (m,1) component of the infrared image sensor components 110, and subsequently and similarly, the drains of the load transistors 104_2, ..., 104_n are connected to the terminals A of the respective components of the infrared image sensor components 110, respectively. Moreover, the terminal 103_1 is connected to the terminals B of (1,1) component, (1,2) component, ..., (1,n) component of the infrared image sensor components 110, and subsequently and similarly, the terminals 103_2, ..., 103_m are connected to the terminals B of the respective components of the infrared image sensor components 110, respectively. Moreover, the drain of the switching transistor 106_1 is connected to the terminals C of (1,1) component, (2,1) component, ..., (m,1) component of the infrared image sensor components 110, and subsequently and similarly, the drains of the switching transistors 106_2, ..., 106_n are connected to the terminals C of the respective components of the infrared image sensor components 110, respectively. The gate of the switching transistor 106_1 is connected to the terminals 107_1, and subsequently and similarly, the gates of the switching transistors 106_2, ..., 106_n are connected to the terminals 107_2, ..., 107_n, respectively. Moreover, the each source of the switching transistors 106_2, ..., 106_n is connected to the image output line 108. Moreover, the image output line is input to the buffer amplifier 109, and the output of the buffer amplifier is connected to the image output terminal 111. The terminal 101 and the terminal 102 have constant voltage and function as load resistance.

Hereinafter, an amplification circuit 210 of the infrared image sensor elements 110 will be explained.

Figure 10:
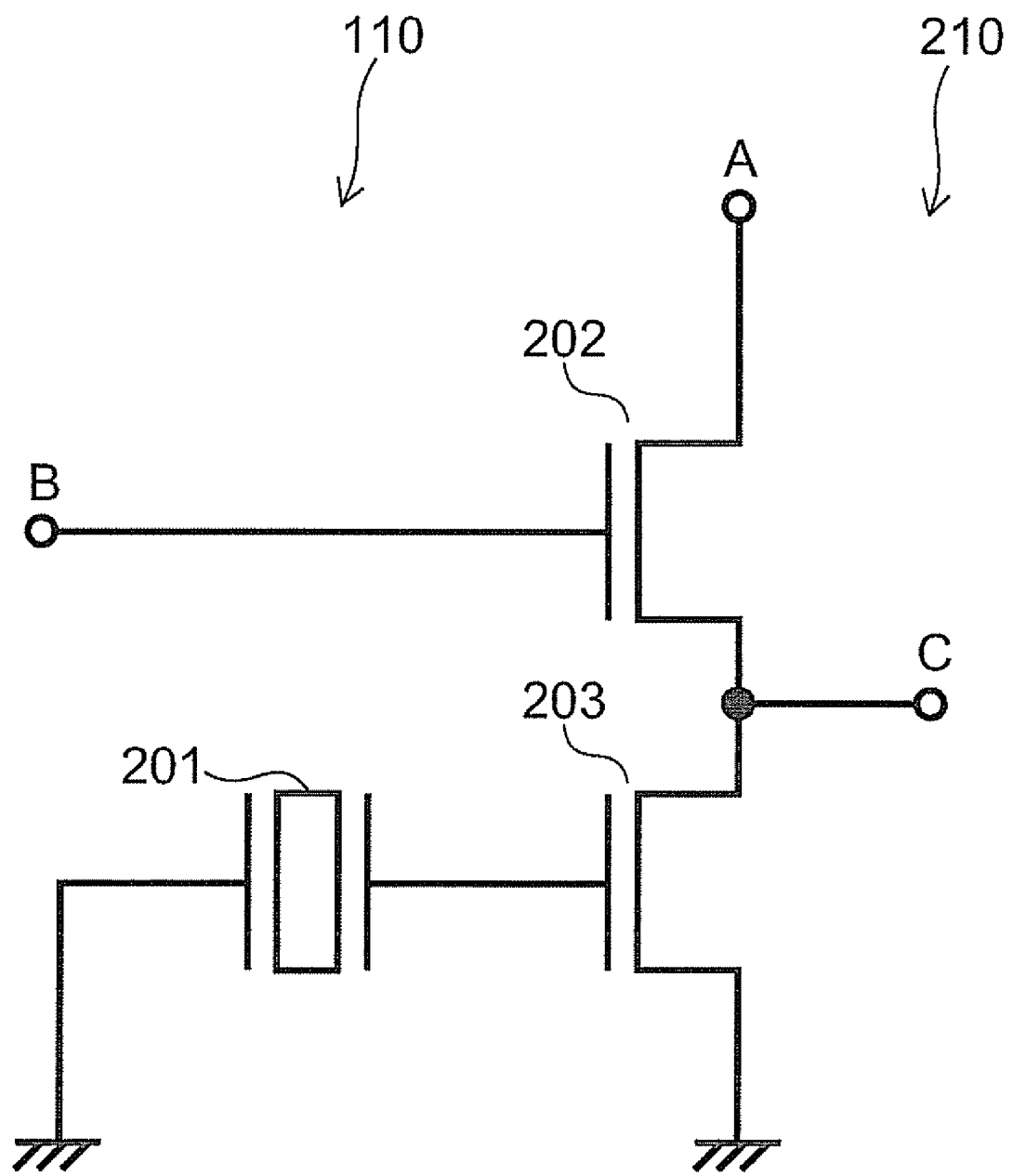
FIG. 10 is a circuit view showing a circuit structure of an infrared image sensor element in the infrared image sensor according to the fourth embodiment of this invention.

FIG. 10 is a circuit view showing a circuit structure of the infrared image sensor element 110 in the infrared image sensor 100 according to the fourth embodiment.

As shown in FIG. 10, the amplification circuit 210 is a circuit for converting information of charge generated in the laminated body 201 into voltage information, and includes the laminated body 201, the first transistor 203 connected to the laminated body 201, and the second transistor 202 connected to the first transistor. Here, the terminal A, the terminal B, and the terminal C represented by FIG. 10 are connected to the terminal A, terminal B, and terminal C of each of the infrared image sensor components 110 shown in FIG. 9, respectively.

Figure 11:
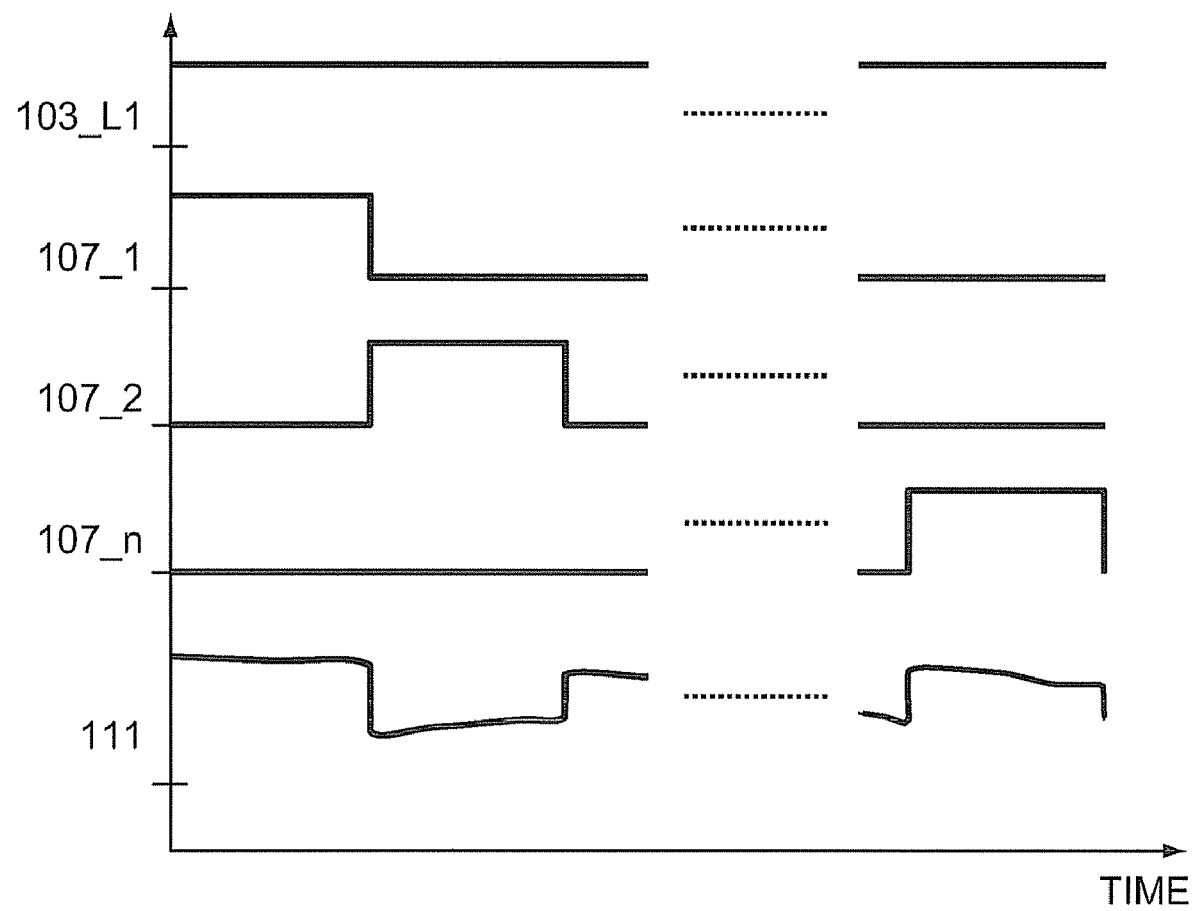
FIG. 11 is a timing chart diagram of a signal wave shape of the infrared image sensor according to the fourth embodiment of this invention.

In the infrared image sensor of the fourth embodiment of this invention, by making the structure shown in FIGS. 9 and 10, such an output signal as shown in FIG. 11 can be obtained. That is, a switching signal is input into each of the terminals 103_1, 103_2, ..., 103_m and the terminals 107_1, 107_2, ..., 107_n, which are shown in FIG. 9, and thereby, each one of the second transistor 202 shown in FIG. 10 and the switching transistor group of 106_1, 106_2, ..., 106_n shown in FIG. 9 becomes in an ON state, and a voltage signal of the terminal C of one infrared image sensor component 110 is output to the image output line 108, and output to the image output terminal 111 through the buffer amplifier 109. Subsequently and similarly, by switching the switching signals, the voltage signals of the terminals C of the infrared image sensor components 110 can be output to the image output terminal 111. Based on the output signals, it becomes possible to visualize the infrared information input into the infrared image sensor 100.

Although not shown, in order that production variation of the residual charge such as the interconnection connecting the infrared image sensor element 201 and the gate of the first transistor 203 is made to be the same in each of the infrared image sensor components 110, the switch of earthing the interconnection is formed between the above-described interconnection and the ground, and thereby, the mechanisms for making the switch for a determined time be in an ON state in the initial startup after the production or in every startup can be included.

Next, an infrared image sensor system to which the infrared image sensor of the fourth embodiment is applied will be explained.

Figure 12:
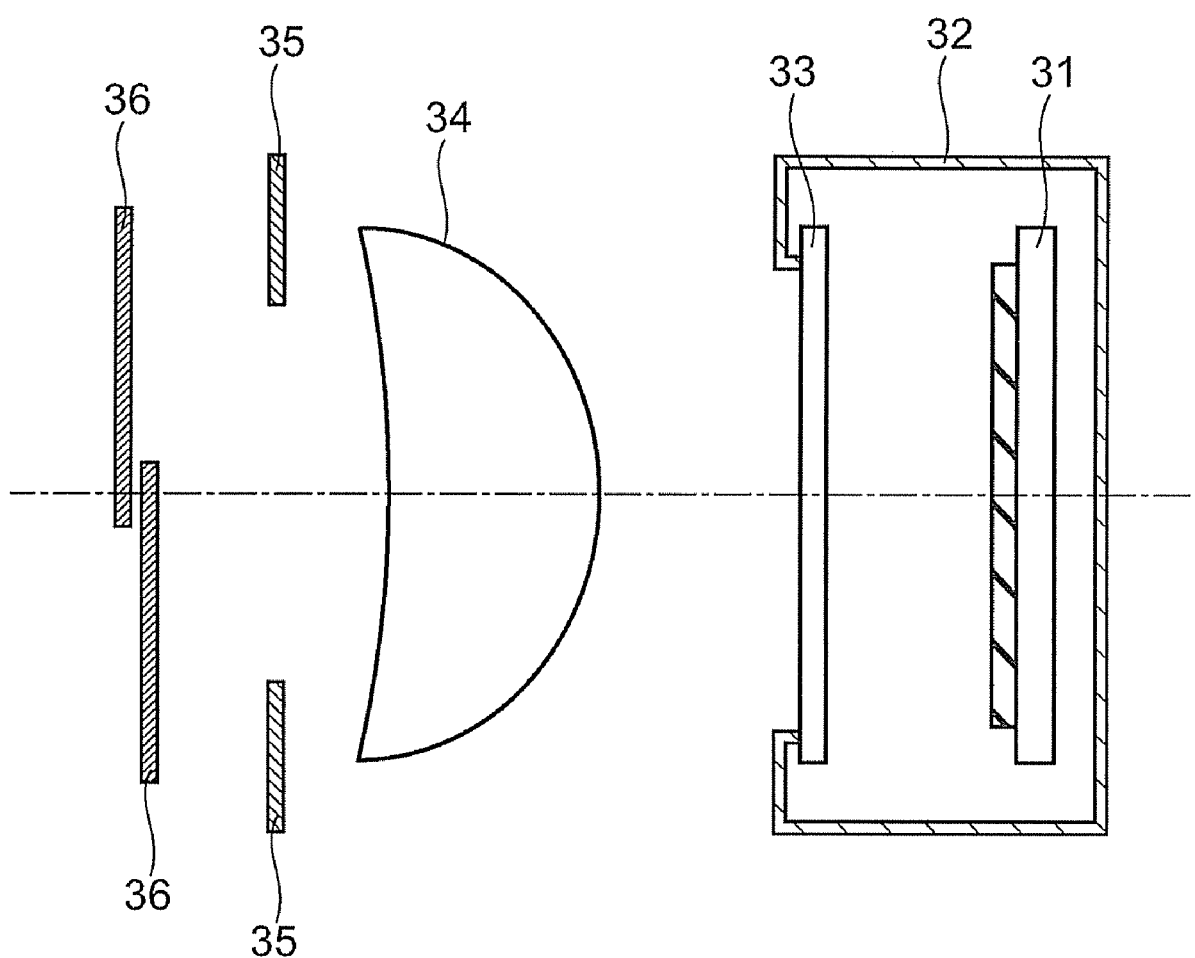
FIG. 12 is a schematic view showing an optical system of the infrared image sensor system using the infrared image sensor according to the fourth embodiment of this invention.

FIG. 12 is a schematic view showing an optical system of the infrared image sensor system using the infrared image sensor according to the fourth embodiment of this invention. The infrared image sensor 31 is vacuum-sealed in a package 32 having a window 33. A lens 34 for collecting infrared, a diaphragm 35, and a chopper 36 are disposed before the window 33. By making the infrared be ON/OFF by the chopper 36, the infrared-detecting element of the infrared image sensor 31 generates temperature difference $\Delta T$, and thereby, electromotive force $\Delta V$ is generated, and strength of the infrared can be detected by reading $\Delta V$ by the amplifier.

By using the infrared image sensor system produced by such a procedure, performance was evaluated. Therefore, it was confirmed that NETD index, which represents detection performance of infrared, is 0.07° C., which is very high accurate.

By the way, in the laminated body 51 in the present invention, relatively large electromotive force can be obtained with respect to the infrared irradiation, but the generated charge amount is relatively small. Therefore, it is effective that the amplifier 10 for reading the electromotive force generated in the laminated body 51 is arranged in the vicinity of the laminated body 51 and thereby the interconnection capacity between the laminated body 51 and the amplifier 10 or the input parasitic capacitance of the amplifier 10 in itself is reduced. Accordingly, when the laminated bodies 51 are arranged in a matrix shape as the infrared image sensor components, the amplifier 10 is provided for each of the infrared image components, and after the information of charge generated in the laminated body 51 is converted to the voltage information, it is effective to sequentially read a signal wave shape of each of the matrixes.

As described above, the embodiments of this invention has been explained with reference to specific examples. However, this invention is not limited to these specific examples. For example, specific size relation or material of each component composing the infrared-detecting element and the infrared image sensor such as the substrate, the lower electrode, the upper electrode, the piezoelectric film, the anchor, the amplifier, and the infrared-absorbing film is included in the scope of this invention as long as a skilled person in the art can select it appropriately from a known scope and can carry out this invention in the same manner and thereby the same effect can be obtained.

Moreover, combination of two or more components of the respective specific examples in the technically possible scope is also included in the scope of this invention as long as including the substance of this invention.

In addition, all of the infrared-detecting elements and the infrared image sensors that can be appropriately design-changed and carried out by a skilled person in the art base on the above-described infrared-detecting element and the infrared image sensor which are described above as the embodiments of this invention belong to the scope of this invention as long as including the substance of this invention.

In, addition, in the category of the idea of this invention, it is understood that various changed examples and modified examples that can be achieved by a skilled person in the art also belong to the scope of this invention.

The invention claimed is:

1. An infrared image sensor in which a plurality of infrared-detecting elements are arranged in an array form, the infrared-detecting element including:
    a substrate;
    a laminated body having a lower electrode, an upper electrode, and a piezoelectric film made of aluminum nitride which is provided between the lower electrode and the upper electrode and in which a c-axis is oriented almost perpendicularly to a film plane;
    an anchor coupling a part of the laminated body with the substrate and supporting the laminated body with a gap above the substrate; and
    an amplifier provided on the substrate and connected to at least one of the lower electrode and the upper electrode, wherein the amplifier including:
    a first transistor;
    a second transistor;
    a first terminal for applying voltage to a gate of the second transistor;
    a second terminal for applying voltage to a source of the second transistor; and
    a third terminal for getting voltage out of a drain of the first transistor,
    any one of the upper electrode and the lower electrode being connected to a gate of the first transistor,
    the other of the upper electrode and the lower electrode being earthed,
    the drain of the first transistor being connected to a drain of the second transistor and to the third terminal,
    a source of the first transistor being earthed,
    the gate of the second transistor being connected to the first terminal, and
    the source of the second transistor being connected to the second terminal.

2. The sensor according to claim 1, wherein an orientation full width at half maximum of the c-axis of the piezoelectric film is 5° or less.

3. The sensor according to claim 1, wherein a difference between a linear expansion coefficient of the upper electrode and the lower electrode and a linear expansion coefficient of the piezoelectric film is $5 \times 10^{-6}$/K or more.

4. The sensor according to claim 1 wherein a difference between a linear expansion coefficient of the upper electrode and the lower electrode and a linear expansion coefficient of the piezoelectric film is $10 \times 10^{-6}$/K or more.

5. The sensor according to claim 1, wherein the upper electrode and the lower electrode contain at least any one of aluminum and copper.

6. The sensor according to claim 1, wherein the laminated body further has an aluminum-tantalum layer provided on the substrate side of the lower electrode.

7. The sensor according to claim 1, wherein $(t_{TE} \cdot E_{TE} + t_{BE} \cdot E_{BE})/(t_p \cdot E_p)$ is from 0.1 to 10, where a thickness of the upper electrode is $t_{TE}$, an in-film-plane longitudinal elasticity modulus of the upper electrode is $E_{TE}$, a thickness of the lower electrode is $t_{BE}$, an in-film-plane longitudinal elasticity modulus of the upper electrode is $E_{BE}$, a thickness of the piezoelectric film is $t_p$ and the in-film-plane longitudinal elasticity modulus is $E_p$.

8. The sensor according to claim 1, wherein $(t_{TE} \cdot E_{TE} + t_{BE} \cdot E_{BE})/(t_p \cdot E_p)$ is from 0.2 to 5, where a thickness of the upper electrode is $t_{TE}$, an in-film-plane longitudinal elasticity modulus of the upper electrode is $E_{TE}$, a thickness of the lower electrode is $t_{BE}$, an in-film-plane longitudinal elasticity modulus of the upper electrode is $E_{BE}$, a thickness of the piezoelectric film is $t_p$ and the in-film-plane longitudinal elasticity modulus is $E_p$.

9. The sensor according to claim 1, wherein the laminated body further has an infrared-absorbing film provided on the upper electrode.

10. The sensor according to claim 9, wherein a linear expansion coefficient of the infrared-absorbing film is larger than a linear expansion coefficient of the piezoelectric film by $5 \times 10^{-6}$/K or more.

11. The sensor according to claim 1, wherein the laminated body further has a first infrared-absorbing film provided on the upper electrode and a second infrared-absorbing film provided beneath the lower electrode, and the first and second infrared-absorbing films are made of a substantially same material and have a substantially same film-thickness.

12. The sensor according to claim 1, wherein a heat capacity of a thermosensitive portion including the piezoelectric film is ten times or less of a heat capacity of the piezoelectric film.

13. The sensor according to claim 1, wherein a heat capacity of a thermosensitive portion including the piezoelectric film is five times or less of a heat capacity of the piezoelectric film.

14. The sensor according to claim 1, wherein the infrared-detecting element further includes:
    a stripe-shaped connecting beam provided between a thermosensitive portion including the piezoelectric film and the anchor,
    the thermosensitive portion being supported through the connecting beam with a gap above the substrate.

15. The sensor according to claim 1, wherein the laminated body is supported above the substrate by a plurality of anchors provided configured to sandwich the laminated body within a parallel plane to layers of the laminated body.

16. The sensor according to claim 1, wherein the amplifier further includes a switch provided between the gate of the first transistor and the earth terminal, and the switch is configured to make it possible to earth the gate of the first transistor.

* * * * *